(12) United States Patent
Kang et al.

(10) Patent No.: US 9,181,471 B2
(45) Date of Patent: Nov. 10, 2015

(54) WHITE LIGHT EMITTING DEVICE

(71) Applicant: Samsung Electronics Co., Ltd., Suwon-si, Gyeonggi-do (KR)

(72) Inventors: Hyun A Kang, Suwon-si (KR); Oul Cho, Seongnam-si (KR); Eun Joo Jang, Suwon-si (KR); Hyo Sook Jang, Suwon-si (KR); Shin Ae Jun, Seongnam-si (KR); Soo Kyung Kwon, Anyang-si (KR); Won Joo Lee, Pocheon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 87 days.

(21) Appl. No.: 14/059,594

(22) Filed: Oct. 22, 2013

(65) Prior Publication Data

US 2014/0131740 A1    May 15, 2014

(30) Foreign Application Priority Data

Nov. 12, 2012  (KR) .................. 10-2012-0127465

(51) Int. Cl.
*H01J 1/62* (2006.01)
*C09K 11/02* (2006.01)
*C09K 11/88* (2006.01)
*H01L 33/50* (2010.01)

(52) U.S. Cl.
CPC .............. *C09K 11/02* (2013.01); *C09K 11/883* (2013.01); *H01L 33/501* (2013.01); *H01L 33/502* (2013.01); *Y02B 20/181* (2013.01)

(58) Field of Classification Search
CPC ... C09K 11/883; C09K 11/565; H01L 33/502
USPC ......................................... 313/501, 498, 502
See application file for complete search history.

(56) References Cited

U.S. PATENT DOCUMENTS

| 7,279,832 B2 | 10/2007 | Thurk et al. |
| 7,679,277 B2 | 3/2010 | Morioka et al. |
| 2008/0012031 A1* | 1/2008 | Jang et al. ............. 257/89 |
| 2009/0140630 A1 | 6/2009 | Kijima et al. |
| 2011/0103064 A1 | 5/2011 | Coe-Sullivan et al. |

FOREIGN PATENT DOCUMENTS

| KR | 1020090026508 A | 3/2009 |
| KR | 1020090093202 A | 9/2009 |

OTHER PUBLICATIONS

Yoshi Ohno, "Color Rendering and Luminous Efficacy of White LED Spectra", Proc. of SPIE, vol. 5530, 2004, pp. 88-98.

* cited by examiner

*Primary Examiner* — Vip Patel
(74) *Attorney, Agent, or Firm* — Cantor Colburn LLP

(57) ABSTRACT

A light emitting device including: a blue light source; a phosphor; and a semiconductor nanocrystal, and emits white light having a R1-R8 average color rendering index ("CRI") of greater than or equal to about 90, and a R9 red color rendering index (R9) of greater than or equal to about 90.

20 Claims, 4 Drawing Sheets

WHITE LIGHT EMITTING DEVICE

CROSS-REFERENCE TO RELATED APPLICATION

This application claims priority to and the benefit of Korean Patent Application No. 10-2012-0127465, filed on Nov. 12, 2012, and all the benefits accruing therefrom under 35 U.S.C. §119, the entire contents of which are incorporated herein by reference.

BACKGROUND

1. Field

This disclosure relates to a light-emitting device, and particularly, to a white light-emitting device.

2. Description of the Related Art

In general, a white light from a lamp should be designed to have a high color rendering index ("CRI") as well as high luminous efficiency. However, it is known that there is a trade-off between high luminous efficiency and high color rendering index. For example, the luminous efficiency may be increased by emitting single color light of about 555 nanometers (nm), but the color rendering index may be increased by emitting light having a wide spectrum evenly covering a visible light region.

On the other hand, red is important in terms of red/green contrast or color reproducibility, but R9, a saturated red color rendering index, is not included in calculating a general color rendering index or a R1-R8 average color rendering index (in general referred to as Ra) but is regarded as a special color rendering index. In addition, not much attention has been paid to a red light emitter due to low luminous efficiency. Since a white light emitting diode ("LED") fabricated by applying a yttrium aluminum garnet ("YAG") phosphor having a wavelength of 550 nm has a low R9 for red, an attempt has been made to apply a red phosphor thereto to improve the color rendering index. However, such a phosphor has a wide light emitting spectrum including a wavelength region that is invisible to human eyes, and thus may have decreased efficiency.

SUMMARY

A white light emitting device having high luminous efficiency and improved color rendering index is provided.

According to an embodiment, a light emitting device including: a blue light source; a phosphor; and a semiconductor nanocrystal, wherein the light emitting device emits white light having a R1-R8 average color rendering index ("CRI") of greater than or equal to about 90, and a R9 red color rendering index of greater than or equal to about 90 is provided.

The phosphor and the semiconductor nanocrystal may absorb light from the blue light source and emit light, and may be dispersed in a matrix to form an emission layer.

The phosphor and the semiconductor nanocrystal may be respectively dispersed in different matrices to form an emission layer.

The emission layer may be positioned on the blue light source.

The light source may have a light emitting wavelength of about 440 nanometers (nm) to about 460 nm.

The light source may include a light emitting diode ("LED").

The phosphor may have a light emitting spectrum of about 510 nm to about 650 nm and luminous efficiency of greater than or equal to about 70%. Herein, the light emitting spectrum may have a full width at half maximum of about 50 nm to about 130 nm.

The phosphor may have a light emitting spectrum having an asymmetric shape and the difference between left and right full widths at half maximum from a peak wavelength as a baseline may be greater than or equal to about 5 nm.

The phosphor may include either one of an oxide phosphor and a nitride phosphor.

The semiconductor nanocrystal may be selected from a Group II-VI compound, a Group III-V compound, a Group IV-VI compound, a Group IV element, a Group IV compound, and a combination thereof.

The semiconductor nanocrystal may have a light emitting spectrum of about 620 nm to about 650 nm and luminous efficiency of greater than or equal to about 50%. Herein, the light emitting spectrum may have a full width at half maximum of less than about 50 nm.

The semiconductor nanocrystal may have a bilaterally symmetric light emitting spectrum, and may include a first material and a second material, wherein the first material and the second material have a light emitting wavelength difference of greater than or equal to 5 nm.

The semiconductor nanocrystal may have a core/shell structure.

The semiconductor nanocrystal may be coated with a polymer selected from polyacrylic acid; polymethacrylic acid; a polymer having a carboxyl group (—COOH) or a salt thereof (—COOM, wherein M is a monovalent metal cation); a salt including a polymer having a carboxylate anion group (—COO⁻) and a metal cation binding with the carboxylate anion group (wherein the metal cation may have a valence of two or more); and a combination thereof.

The phosphor and the semiconductor nanocrystal may be included at a weight ratio of about 40:1 to about 80:1.

The light emitting device may emit white light having a color temperature of about 2500 K to about 4000 K.

Also disclosed is a light emitting diode array device, including: a blue light emitting diode light source; and an emission layer comprising a phosphor and a semiconductor nanocrystal, wherein the light emitting device emits white light having a R1-R8 average color rendering index of greater than or equal to about 90, and a R9 red color rendering index of greater than or equal to about 90.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
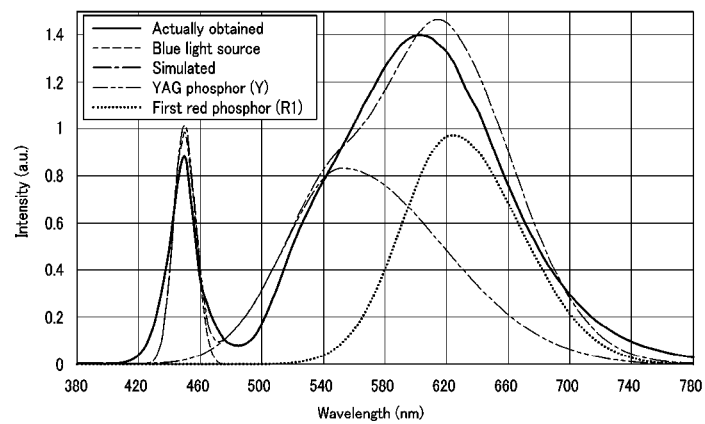
FIGS. 1, 2, and 3 are graphs of intensity (arbitrary units) versus wavelength (nanometers) and respectively show light-emitting spectra of light emitting devices according to Comparative Examples 1 and 2, and Example 1.

This disclosure will be described more fully hereinafter in the following detailed description of this disclosure, in which some but not all embodiments of this disclosure are described.

This disclosure may be embodied in many different forms and is not be construed as limited to the embodiments set forth herein; rather, these embodiments are provided so that this disclosure will fully convey the scope of the invention to those skilled in the art.

In the drawings, the thickness of layers, films, panels, regions, etc. are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

For convenience, the term "mixture" is used to refer to any combination of two different materials irrespective of the form, and thus includes solutions, dispersions, emulsions, alloys, physical mixtures, and the like.

As used herein, when a definition is not otherwise provided, the term "substituted" refers to a compound or group substituted with a substituent selected from a C1 to C30 linear or branched alkyl group, a C2 to C30 alkynyl group, a C6 to C30 aryl group, a C7 to C30 alkylaryl group, a C1 to C30 alkoxy group, a C1 to C30 hetero alkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxyl group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, and a combination thereof instead of hydrogen of a compound.

As used herein, when a definition is not otherwise provided, the term "hetero" means that the compound or group includes 1 to 3 heteroatoms selected from N, O, S, Si, and P.

As used herein, the term "aliphatic organic group" may refer to a C1 to C30 linear or branched alkyl group, the term "aromatic organic group" may refer to a C6 to C30 aryl group or a C2 to C30 heteroaryl group, and the term "alicyclic organic group" may refer to a C3 to C30 cycloalkyl group, a C3 to C30 cycloalkenyl group, or a C3 to C30 cycloalkynyl group.

As used herein, the term "a combination thereof" refers to a mixture, a stacked structure, a composite, an alloy, or the like.

As used herein, (meth)acrylate refers to acrylate and methacrylate, and (meth)acryloxy refers to acryloxy and methacryloxy.

"Alkyl" means a straight or branched chain, saturated, monovalent hydrocarbon group (e.g., methyl or hexyl).

"Alkylene" means a straight or branched chain, saturated, divalent aliphatic hydrocarbon group, (e.g., methylene (—$CH_2$—) or, propylene (—$(CH_2)_3$—)).

"Alkenylene" means a straight or branched chain, divalent hydrocarbon group having at least one carbon-carbon double bond (e.g., ethenylene (—HC=CH—)).

According to an embodiment, a light emitting device includes: a blue light source, a phosphor, and a semiconductor nanocrystal, wherein the light emitting device emits white light having a R1-R8 average color rendering index ("CRI") of greater than or equal to about 90, and a red color rendering index (i.e., R9) of greater than or equal to about 90.

The color rendering index is measured by calculating a difference between eight Munsell samples selected from the International Commission on Illumination ("CIE") under a test light source and the eight Munsell samples under a reference light source at the same correlated color temperature ("CCT"). The reference light source is a black body radiator for a light source having a correlated color temperature of less than or equal to about 5000 K, and a daylight for a light source having a correlated color temperature of greater than or equal to about 5000 K.

The index value for each eight Munsell sample colors are represented as R1-R8, and the average of R1-R8 is denoted by Ra.

Other than the eight colors, additional colors may be used. Among the additional colors, primary colors such as red, yellow, green, and blue are respectively marked as R9, R10, R11, and R12, respectively, which are part of a special color rendering index.

Since a white LED including a YAG phosphor having the highest visibility at a wavelength of 550 nm has low R9 for red, an attempt to improve its color rendering index has been made by applying a red phosphor thereto. However, such a phosphor has a wide light emitting spectrum including a region that is invisible to human eyes, and thus has a drawback of decreasing efficiency. On the contrary, a semiconductor nanocrystal having a narrow light emitting spectrum may be used to fabricate a lamp having a high color rendering index and improved energy efficiency.

Accordingly, an embodiment provides a light emitting device including the semiconductor nanocrystal as well as the phosphor.

The phosphor and the semiconductor nanocrystal may absorb the light from the blue light source and emit light, and may be dispersed in a matrix to form an emission layer.

The phosphor and the semiconductor nanocrystal may be respectively dispersed in different matrices to form an emission layer.

The emission layer may be positioned on the light source.

The light source may emit blue light, for example, light having a wavelength ranging from about 440 nm to about 460 nm.

The light source may include a light emitting diode ("LED") chip, a laser, a lamp, and the like. For example, for the light emitting diode chip, the emission layer may be formed thereon by dispersing the phosphor and the semiconductor nanocrystal in a matrix.

The matrix may be a silicone resin; an epoxy resin; a (meth)acrylate-based resin; a copolymer of a first monomer having at least two thiol (—SH) groups at the terminal end and a second monomer having at least two carbon-carbon unsaturated bonds at the terminal end; or a combination thereof.

The phosphor may include a phosphor used in a related art, but has no particular limit.

The phosphor may include one or more oxide phosphors and/or nitride phosphors, and specifically, they may be selected from SiAlON:Eu, $CaSi_2O_2N_2$:Eu, $SrSi_2O_2N_2$:Eu, $BaSi_2O_2N_2$:Eu, $CaAlSiN_3$:Eu, $Y_3Al_5O_{12}$:Ce, $Y_3(Al,Ga)_5O_{12}$:Ce, and a combination thereof.

The phosphor may have a light emitting spectrum of about 510 nm to about 650 nm and luminous efficiency of greater than or equal to about 70%. The light emitting spectrum may have a full width at half maximum of about 50 nm to about 130 nm.

The phosphor has a light emitting spectrum having a difference of greater than or equal to about 5 nm between left and right full widths at half maximum from a peak wavelength as a center.

The semiconductor nanocrystal may be selected from a Group II-VI compound, a Group III-V compound, a Group IV-VI compound, a Group IV element, a Group IV compound, and a combination thereof.

The Group II-VI compound may be selected from a binary element compound selected from CdSe, CdTe, ZnS, ZnSe, ZnTe, ZnO, HgS, HgSe, HgTe, MgSe, MgS, and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from a binary element compound selected from GaN, GaP, GaAs, GaSb, AlN, AlP, AlAs, AlSb, InN, InP, InAs, InSb, and a combination thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a combination thereof; and a quaternary element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from a binary element compound selected from SnS, SnSe, SnTe, PbS, PbSe, PbTe, and a combination thereof; a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

The Group IV element may be selected from Si, Ge, and a combination thereof.

The Group IV compound may be a binary element compound selected from SiC, SiGe, and a combination thereof.

Herein, the element, the binary compound, the ternary compound, or the quaternary compound may be present in the form of particles in a substantially uniform concentration, or may be present the form of particles having different concentration distributions. In addition, each particle may have a core/shell structure in which a first semiconductor nanocrystal is surrounded by a second semiconductor nanocrystal. The core and shell may have an interface, and an element of at least one of the core and the shell may have a concentration gradient that decreases in a direction from the surface of the particle to the center of the particle.

When the semiconductor nanocrystal has a core/shell structure, the semiconductor nanocrystal may effectively show the quantum confinement effect since the material composition for the shell has a higher energy band gap than that of the core.

In the case of having a multi-layered shell, the energy band gap of the shell disposed on the exterior of the core is higher than that of the shell closer to the core.

The semiconductor nanocrystal may have quantum efficiency of about 30% to about 100%, for example, greater than or equal to about 50%, greater than or equal to about 70%, greater than or equal to about 80%, or greater than or equal to about 90%. Within the range, the semiconductor nanocrystal may improve the luminous efficiency of a light emitting device.

In an embodiment, the semiconductor nanocrystal may have a light emitting spectrum of about 620 nm to about 650 nm, the light emitting spectrum may have a full width at half maximum of less than about 50 nm, and the semiconductor nanocrystal may have luminous efficiency of greater than or equal to about 50%.

However, the full width at half maximum ("FWHM") of the light emitting wavelength spectrum of the semiconductor nanocrystal may be designed to be narrower or wider according to the application.

The semiconductor nanocrystal may have the full width at half maximum of a light emitting wavelength spectrum of less than or equal to about 50 nm, for example, less than or equal to about 40 nm, or less than or equal to about 30 nm. When the semiconductor nanocrystal is used to fabricate a lamp and the like, a color rendering index (hereinafter referred to as CRI) may be improved by mixing semiconductor nanocrystals having various light emitting wavelengths or designing it to have a wider full width at half maximum. The semiconductor nanocrystal has a bilaterally symmetric light emitting spectrum, and may include two or more materials having a light emitting wavelength difference of greater than or equal to about 5 nm. For example, the semiconductor nanocrystal may include a first material and a second material, wherein the first material and the second material have a light emitting wavelength difference of greater than or equal to 5 nanometers.

The semiconductor nanocrystal may have a particle diameter (e.g., an average largest particle diameter) of about 1 nm to about 100 nm, specifically about 1 nm to about 50 nm, and more specifically about 1 nm to about 10 nm, or about 2 nm to about 25 nm.

In addition, the semiconductor nanocrystal may have any suitable shape used in this art, but is not specifically limited thereto. Examples thereof may include a sphere, a pyramid, a multi-arm, or a cubic nanoparticle, a nanotube, a nanowire, a nanofiber, a nanoplate particle, or the like.

The semiconductor nanocrystal may be synthesized according any suitable method known in this art. For example, it may be synthesized according to a well-known method in this art.

A polymer may be disposed on the semiconductor nanocrystal. In an embodiment, the semiconductor nanocrystal may be coated with a polymer. The polymer may be selected from a polyacrylic acid; a polymethacrylic acid; a polymer having a carboxyl group (—COOH) or a salt thereof (—COOM, wherein M is a monovalent metal cation); a salt including a polymer having a carboxylate anion group (—COO⁻) and a metal cation binding with the carboxylate anion group (wherein the metal cation has a valence of two or more); and a combination thereof.

The polymer having the carboxyl group or a salt thereof may be selected from a poly(alkylene-co-acrylic acid), a poly(alkylene-co-methacrylic acid), a salt thereof, and a combination thereof. In an embodiment, the polymer may be a poly(alkylene-co-acrylic acid) such as poly(ethylene-co-acrylic acid) and the like, a poly(alkylene-co-methacrylic acid) such as a poly(ethylene-co-methacrylic acid) and the like, a poly(styrene-co-acrylic acid), a poly(styrene-co-methacrylic acid), or a salt thereof.

The salt may include a compound including a metal such as sodium, zinc, indium, gallium, and the like instead of hydrogen of a carboxyl group. The salt may include a poly(ethylene-co-acrylic acid)zinc salt, a poly(ethylene-co-methacrylic acid)zinc salt, and the like.

The polymer having a carboxylate anion group may be a polymer having a structural unit represented by the following Chemical Formula 1.

Chemical Formula 1

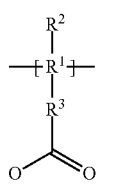

In Chemical Formula 1, $R^1$ is a substituted or unsubstituted C2 to C20 linear or branched alkylene group, $R^2$ is hydrogen or a methyl group, and $R^3$ is a substituted or unsubstituted C1 to C50 alkylene group; a substituted or unsubstituted C2 to C50 alkenylene group; a C1 to C50 alkylene group wherein at least one methylene group (—CH$_2$—) is substituted with a sulfonyl (—S(=O)$_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 alkyl group), —NR— (wherein R is hydrogen or a C1 to C10 alkyl group), or a combination thereof; or a C2 to C50 alkenylene group wherein at least one methylene group (—CH$_2$—) is substituted with a sulfonyl (—S(=O)$_2$—), a carbonyl (—C(=O)—), an ether (—O—), a sulfide (—S—), a sulfoxide (—S(=O)—), an ester (—C(=O)O—), an amide (—C(=O)NR—) (wherein R is hydrogen or a C1 to C10 alkyl group), —NR— (wherein R is hydrogen or a C1 to C10 alkyl group); or a combination thereof.

The monovalent metal anion may be a cation of an alkali metal, for example, a cation of a metal selected from Na, K, Rb, and a combination thereof.

The metal cation having a valence of two or more may be a cation of a metal selected from an alkaline-earth metal, a rare earth element, a transition element, a Group 12 element, a Group 13 element, and a combination thereof, and for example a cation of a metal selected from Mg, Ca, Ba, Sc, Y, Ti, V, Cr, Mn, Fe, Co, Ni, Cu, Ga, Sr, Zr, Nb, Mo, Au, Zn, Cd, Hg, In, Tl, and a combination thereof.

The polymer having a carboxyl group or a salt thereof may include about 1 to about 100 mol % of a carboxyl group or a salt thereof in the polymer. The polymer may have a melting point ($T_m$) of about 50° C. to about 300° C. When the polymer includes a carboxyl group or a salt thereof within the range, and has a melting point within the range, the polymer may be stably coated on the semiconductor nanocrystal.

The semiconductor nanocrystal coated with the polymer may include the semiconductor nanocrystal in an amount of about 1 to about 70 wt %, based on the total weight of the polymer and the semiconductor nanocrystal.

The polymer coated on the semiconductor nanocrystal may form a dense polymer network and stably protect the semiconductor nanocrystal. Accordingly, the semiconductor nanocrystal may stably maintain luminous efficiency for a long period.

The semiconductor nanocrystal coated with the polymer may be prepared as a powder or a film. For example, the emission layer may be formed by uniformly dispersing the semiconductor nanocrystal prepared as a powder and the phosphor into a matrix. In addition, the semiconductor nanocrystal prepared as a film may be laminated on a resin in which the phosphor is dispersed.

The phosphor and the semiconductor nanocrystal coated with the polymer may be included in a weight ratio ranging from about 6:1 to about 12:1. When the phosphor and the semiconductor nanocrystal coated with the polymer are included within the range, a light emitting device may have a R1-R8 average color rendering index greater than or equal to about 90 and a red color rendering index R9 of greater than or equal to about 90. Herein, the light emitting device may have luminous efficiency of greater than or equal to about 55 lumens per watt (lm/w), specifically, greater than or equal to about 60 lm/w, more specifically, greater than or equal to about 65 lm/w, and much more specifically, greater than or equal to about 70 lm/w.

In addition, the light emitting device including an emission layer and a light source according to the embodiment may emit white light having a color temperature ranging from about 2500 K to about 4000 K.

As the light emitting device includes a phosphor and a semiconductor nanocrystal, it may have both a high R1-R8 average color rendering index and a high red color rendering index R9 without deteriorating luminous efficiency.

Figure 5:
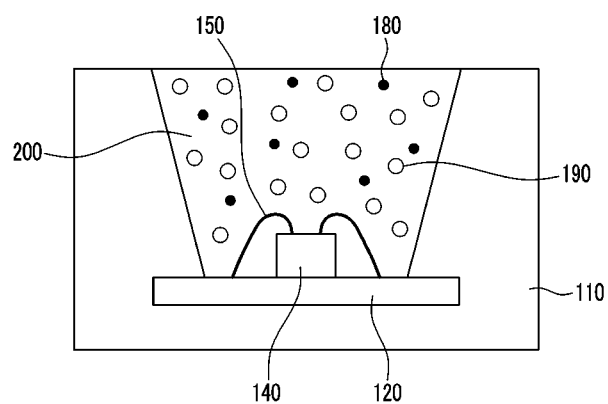
FIG. 5 is a schematic cross-sectional view of a light emitting diode (LED) according to an exemplary example.

Hereafter, a light emitting diode is described with reference to FIG. 5 as an example of a light emitting device according to an embodiment. FIG. 5 illustrates a schematic cross-sectional view of a light emitting diode according to an embodiment.

Referring to FIG. 5, the light emitting diode may include a mold 110; a lead frame 120 disposed in the inside of the mold 110; a light emitting diode chip 140 mounted on the lead frame 120; a bonding wire 150 connecting the lead frame 120 and the light emitting diode chip 140; and a matrix 200 covering the light emitting diode chip 140 and including a semiconductor nanocrystal 180 and a phosphor 190.

The semiconductor nanocrystal 180 and phosphor 190 may emit light of a predetermined wavelength in response to the light emitted from the light emitting diode chip 140, which is a light emitting region. For example, the light emitting diode chip 140 may emit blue light of 440 nanometers to 460 nanometers.

Hereinafter, the present disclosure is illustrated in more detail with reference to examples. However, they are exemplary embodiments, and the present disclosure is not limited thereto.

EXAMPLES

Preparation Example 1

Synthesis of Red Semiconductor Nanocrystal Coated with Polymer

A polymer solution is prepared by putting about 0.848 grams (g) of a polyethylene-co-polyacrylic acid copolymer (including 15 weight percent (wt %) of polyacrylic acid) in a flask and adding about 4.5 milliliters (mL) of toluene thereto under a nitrogen atmosphere. The polymer solution is heated up to about 100° C. to dissolve the polymer.

A semiconductor nanocrystal dispersion solution is prepared by dispersing a red semiconductor nanocrystal (CdSe/CdS/ZnS) having a light-emitting wavelength of about 626 nm into about 2.5 mL of toluene to have an optical density (OD) (absorbance of the first maximum absorption wavelength in the UV-Vis absorption spectrum of an about 100 times-diluted solution) of about 0.051.

The semiconductor nanocrystal dispersion solution is mixed with the aforementioned polymer solution, and the mixture is stirred at about 100° C. for about 30 minutes. Then, about 4.4 mL of 0.2 molar (M) diethylzinc ($Zn(Et)_2$) solution is added in a dropwise fashion to the stirred mixture. The resulting mixture is reacted for about 30 minutes. After the reaction, the reacting product is cooled down to about 50° C., filtered, and then washed with hexane and vacuum-dried, preparing a red semiconductor nanocrystal coated with a polyethylene-polyacrylic acid copolymer having a coordination bond with a zinc cation.

Herein, the coated polymer is included in an amount of about 578 parts by weight, based on 100 parts by weight of the red semiconductor nanocrystal.

Example 1

Fabrication of Light Emitting Device Including Semiconductor Nanocrystal and Phosphor A matrix resin is prepared by mixing OE6630A and OE6630B made by Dow Corning Co. in a weight ratio of 1:4 and removing a gas bubble therefrom. Separately, 20 milligrams (mg) of the red semiconductor nanocrystal coated with a polymer according to Preparation Example 1 is mixed with 150 mg of a YAG phosphor to emit white light of about 2700 K. Then, the mixture is uniformly mixed with 935 mg of the matrix resin. The resulting mixture is coated in a small amount in the recess portion of a circuit board in which a light emitting diode chip emitting blue light with a wavelength of 444 nm is installed, and is cured at 150° C. for 2 hours to form an emission layer, fabricating a light emitting device.

The red semiconductor nanocrystal coated with a polymer has a light emitting wavelength of about 630 nm and a full width at half maximum of about 38 nm, which is left and right symmetrical.

The YAG phosphor (Y) has a light emitting wavelength of about 552 nm and a full width at half maximum of about 123 nm, in which about 45 nm to the left from the peak and about 78 nm to the right thereof.

Comparative Examples 1 to 3

Fabrication of Light Emitting Devices Including Phosphors

Each light emitting device is fabricated to produce white light of about 2700 K according to the same method as Example 1, except that only phosphor was used according to Comparative Examples 1 to 3.

In other words, the light emitting device according to Comparative Example 1 is fabricated by mixing the same YAG phosphor as the one used in Example 1 and a first red phosphor (R1) having a light emitting wavelength of about 623 nm and a full width at half maximum of about 92 nm (about 39 nm to the left of the peak and about 53 nm to the right therefrom) with a matrix resin OE6630. The amounts of the YAG phosphor and the first red phosphor are selected to emit white light of about 2700 K.

In Comparative Example 2, the light emitting device is fabricated by mixing a green phosphor (G) having a light emitting wavelength of about 539 nm and a full width at half maximum of about 56 nm (about 25 nm to the left of the peak and about 31 nm to the right thereof) and the first red phosphor (R1) used in Comparative Example 1, with a matrix resin OE6630 and curing the mixture. The amounts of the green phosphor (G) and the first red phosphor (R1) are selected to emit white light of about 2700 K.

In Comparative Example 3, the light emitting device is fabricated by mixing the green phosphor (G), the first red phosphor (R1), and a second red phosphor (R2) having a light emitting wavelength of about 643 nm and a full width at half maximum of about 92 nm (about 41 nm to the left of the peak and about 51 nm to the right thereof) with a matrix resin OE6630. The amounts of the green phosphor (G), the first red phosphor (R1), and the second red phosphor ($R_2$) are selected to emit white light of about 2700 K.

Figure 2:
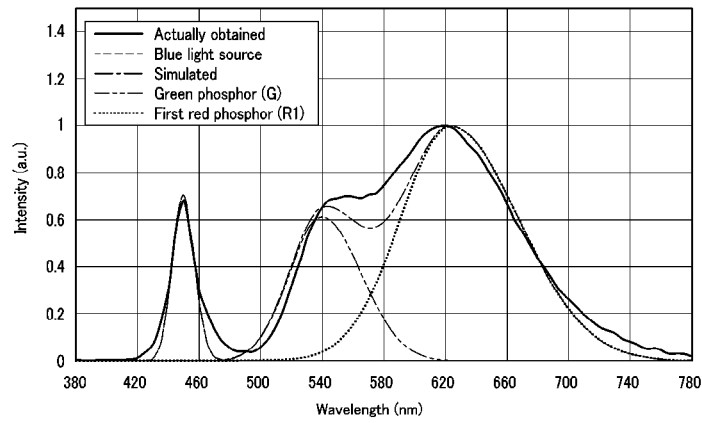
Figure 3:
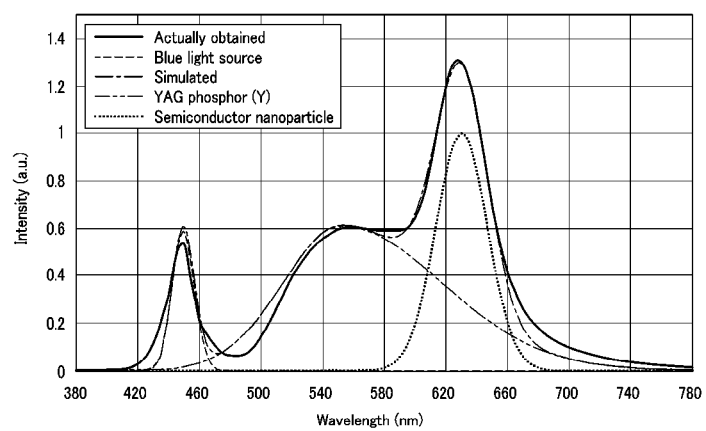

The light emitting devices according to Comparative Examples 1 and 2, and Example 1 are simulated to obtain a color rendering index, a red color rendering index, and luminous efficacy. The results are provided in following Table 1. In addition, the light emitting devices according to Comparative Examples 1 and 2, and Example 1 are also simulated to obtain light emitting spectra. The light emitting spectra obtained through simulation of the light emitting devices are marked as a dotted line, while actually-measured light emitting spectra thereof are marked as a solid line. The results are respectively provided in FIGS. 1, 2, and 3.

As shown in Table 1, the simulation of the light emitting devices shows that the color rendering index and the red color rendering index are increased up to greater than or equal to about 90 without deteriorating luminous efficacy when a red semiconductor nanocrystal is mixed with a phosphor.

TABLE 1

| Comparative Example 1 | | | Comparative Example 2 | | | Example 1 | | |
|---|---|---|---|---|---|---|---|---|
| CRI | R9 | luminous efficacy | CRI | R9 | luminous efficacy | CRI | R9 | luminous efficacy |
| 84 | 28 | 316 | 88 | 71 | 301 | 93 | 95 | 326 |

The light emitting devices according to Comparative Examples 1, 2, and 3, and Example 1 are measured regarding R1-R8 average color rendering index ("CRI"), red color rendering index (R9), and relative efficiency. The results are provided in following Table 2. In addition, FIG. 4 shows color rendering index of each light emitting device and color rendering index corresponding to (R1)-(R16).

TABLE 2

|  | Cx | Cy | CRI | R9 | Relative efficiency |
|---|---|---|---|---|---|
| Comparative Example 1 | 0.449 | 0.397 | 75 | −3 | 100% |
| Comparative Example 2 | 0.450 | 0.394 | 80 | 35 | 80% |
| Comparative Example 3 | 0.450 | 0.394 | 88 | 92 | 72% |
| Example 1 | 0.454 | 0.393 | 92 | 91 | 93% |

Figure 4:
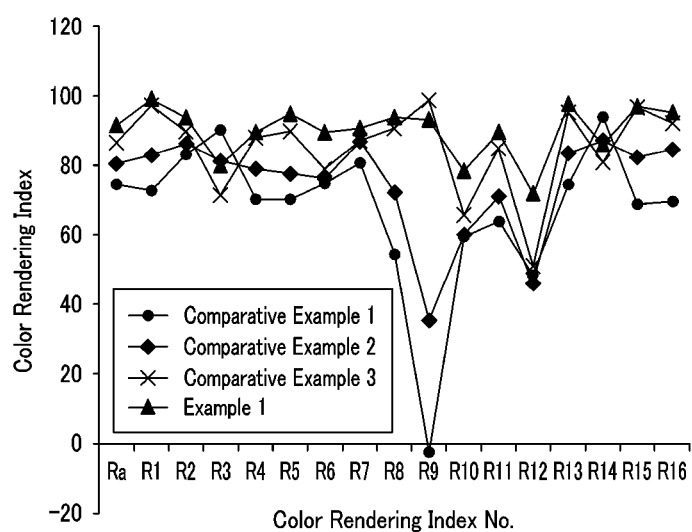
FIG. 4 is a graph of color rendering index versus color rendering index number and shows color rendering indexes of the light emitting devices according to Comparative Example 1 and 2, and Example 1.

As shown in FIG. 4 and Table 2, the light emitting device according to Example 1 may minimize a luminous efficiency decrease but have both of a high R1-R8 average color rendering index and a high red color rendering index R9 of greater than 90. On the other hand, the light emitting device including a red phosphor according to Comparative Example 3 has a highly-increased red color rendering index but highly-decreased efficiency of 72%.

Comparative Examples 4 to 6

Fabrication of Light Emitting Devices Including Semiconductor Nanocrystals and Phosphors in Different Weight Ratios Each light emitting device according to Comparative Examples 4 to 6 is fabricated according to the same method as Example 1 by using a semiconductor nanocrystal and a phosphor, but using a different kind of phosphor having the same color temperature as the one according to Example 1, and a different weight ratio of the phosphor with the semiconductor nanocrystal.

Specifically, the light emitting device of Comparative Example 4 is fabricated by mixing the green phosphor (G) used in Comparative Examples 2 and 3, and the YAG phosphor used in Comparative Example 1, with the red semiconductor nanocrystal according to Preparation Example 1. Herein, the phosphor is mixed with the red semiconductor nanocrystal coated with a polymer in a weight ratio of about 5:1 to provide a color temperature of 2700 K.

In addition, a light emitting device according to Comparative Example 5 is fabricated using the YAG phosphor and the first red phosphor (R1) according to Comparative Example 1, and the red semiconductor nanocrystal according to Preparation Example 1. Herein, the phosphor is mixed with the semiconductor nanocrystal coated with a polymer in a weight ratio of about 13:1 to provide a color temperature of 2700 K.

In addition, a light emitting device according to Comparative Example 6 is fabricated by mixing the green phosphor (G), the YAG phosphor, and the first red phosphor (R1) with the red semiconductor nanocrystal according to Preparation Example 1. Herein, the phosphor is mixed with the semiconductor nanocrystal coated with a polymer in a weight ratio of about 13:1 to provide a color temperature of 2700 K.

The light emitting devices fabricated by changing the weight ratio between the phosphors and the semiconductor nanocrystals according to Example 1 and Comparative Examples 4 to 6, and the light emitting device according to Comparative Example 1 as a comparison group are measured regarding color rendering index. The results are provided in following Table 3.

TABLE 3

|  | Weight ratio (phosphor:semiconductor nanocrystal coated with polymer) (wt) | Cx | Cy | CRI | R9 | Efficiency (lm/w) | Relative efficiency |
|---|---|---|---|---|---|---|---|
| Comparative Example 1 |  | 0.443 | 0.393 | 75 | −1 | 79.6 | 100% |
| Example 1 | 7.5:1 | 0.451 | 0.394 | 92 | 93 | 73.3 | 92% |
| Comparative Example 4 | 5:1 | 0.448 | 0.395 | 87 | 83 | 64.5 | 81% |
| Comparative Example 5 | 13:1 | 0.448 | 0.394 | 84 | 46 | 78.0 | 98% |
| Comparative Example 6 | 13:1 | 0.453 | 0.396 | 86 | 63 | 70.7 | 89% |

As shown from Table 3, when the phosphor and the semiconductor nanocrystal coated with a polymer are mixed in a weight ratio ranging from about 6:1 to about 12:1, the R1-R8 average color rendering index and the red color rendering index R9 are both increased to greater than or equal to 90. In addition, the light emitting device including a light emitting film using the phosphor and the semiconductor nanocrystal coated with a polymer in a weight ratio of 7.5:1 according to Example 1 has luminous efficiency of 73.3 lm/w and a high red color rendering index R9, and maintains commercially-viable luminous efficiency.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting device comprising:
   a blue light source;
   a phosphor; and
   a semiconductor nanocrystal,
   wherein the light emitting device emits white light having a R1-R8 average color rendering index of greater than or equal to about 90, and a R9 red color rendering index of greater than or equal to about 90, and
   wherein the semiconductor nanocrystal has a wavelength of maximum intensity of greater than 620 nanometers to about 650 nanometers.

2. The light emitting device of claim 1, wherein the light emitting device emits white light having a color temperature of about 2500 Kelvin to about 4000 Kelvin.

3. The light emitting device of claim 1, wherein the light source has a light emitting wavelength of about 440 nanometers to about 460 nanometers.

4. The light emitting device of claim 1, wherein the light source comprises a light emitting diode.

5. The light emitting device of claim 1, wherein the phosphor has a light emitting spectrum of about 510 nanometers to about 650 nanometers, the light emitting spectrum has a full width at half maximum of about 50 nanometers to about 130 nanometers, and the phosphor has luminous efficiency of greater than or equal to about 70 percent.

6. The light emitting device of claim 5, wherein the phosphor has a difference between left and right full widths at half maximum from a peak wavelength of a light emitting spectrum of greater than or equal to about 5 nanometers.

7. The light emitting device of claim 5, wherein the phosphor comprises at least one of an oxide phosphor and a nitride phosphor.

8. The light emitting device of claim 1, wherein
the light emitting spectrum has a bilaterally symmetric light emitting spectrum having a full width at half maximum of less than about 50 nanometers, and
the semiconductor nanocrystal has luminous efficiency of greater than or equal to about 50 percent.

9. The light emitting device of claim 1, wherein the semiconductor nanocrystal comprises at least a first material and a second material, wherein the first material and the second material have a light emitting wavelength difference of greater than or equal to 5 nanometers.

10. The light emitting device of claim 1, wherein the semiconductor nanocrystal is selected from a Group II-VI compound, a Group III-V compound, a Group IV-VI compound, a Group IV element, a Group IV compound, and a combination thereof.

11. The light emitting device of claim 1, wherein the semiconductor nanocrystal has a core/shell structure.

12. The light emitting device of claim 1, wherein the phosphor and the semiconductor nanocrystal are included at a weight ratio of about 40:1 to about 80:1.

13. The light emitting device of claim 1, further comprising a polymer having a carboxyl group or a salt thereof disposed on the semiconductor nanocrystal surface.

14. The light emitting device of claim 13, wherein the polymer having a carboxyl group or a salt thereof is selected from a poly(alkylene-co-acrylic acid) or a salt thereof, a poly(alkylene-co-methacrylic acid) or a salt thereof, a poly(styrene-co-acrylic acid) or a salt thereof, a poly(styrene-co-methacrylic acid) or a salt thereof, and a combination thereof.

15. The light emitting device of claim 13, wherein the phosphor and the semiconductor nanocrystal having the polymer disposed thereon are combined in a weight ratio ranging from about 6:1 to about 12:1.

16. The light emitting device of claim 1, which emits white light having luminous efficiency of greater than or equal to about 60 lumens per watt at a color temperature ranging from about 2500 Kelvin to about 4000 Kelvin.

17. A light emitting diode array device, comprising:
a blue light emitting diode light source; and
an emission layer comprising a phosphor and a semiconductor nanocrystal,
wherein the light emitting device emits white light having a R1-R8 average color rendering index of greater than or equal to about 90, and a R9 red color rendering index of greater than or equal to about 90, and
wherein the semiconductor nanocrystal has a wavelength of maximum intensity of greater than 620 nanometers to about 650 nanometers.

18. The light emitting diode array device of claim 17, wherein
the light emitting spectrum is a bilaterally symmetric light emitting spectrum having a full width at half maximum of less than about 50 nanometers, and
the semiconductor nanocrystal has luminous efficiency of greater than or equal to about 50 percent.

19. The light emitting diode array device of claim 17, further comprising a polymer having a carboxyl group or a salt thereof disposed on the semiconductor nanocrystal surface.

20. The light emitting device of claim 1, wherein the semiconductor nanocrystal has a light emitting spectrum of 625 nm to about 650 nm.

* * * * *